(12) United States Patent
Thomas

(10) Patent No.: US 12,033,851 B1
(45) Date of Patent: Jul. 9, 2024

(54) LEFT-ISD-LTSEE {LOW ELECTROSTATIC FIELD TRANSISTOR (LEFT) USING IMPLANTED S/D AND SELECTIVE LOW TEMPERATURE EPITAXIAL EXTENSION (ISD-LTSEE)}

(71) Applicant: Mammen Thomas, Seattle, WA (US)

(72) Inventor: Mammen Thomas, Seattle, WA (US)

( * ) Notice: Subject to any disclaimer, the term of this patent is extended or adjusted under 35 U.S.C. 154(b) by 0 days.

(21) Appl. No.: 18/417,199

(22) Filed: Jan. 19, 2024

(51) Int. Cl.
| | |
|---|---|
| H01L 21/02 | (2006.01) |
| H01L 29/06 | (2006.01) |
| H01L 29/08 | (2006.01) |
| H01L 29/78 | (2006.01) |

(52) U.S. Cl.
CPC .. *H01L 21/02293* (2013.01); *H01L 21/02532* (2013.01); *H01L 29/0638* (2013.01); *H01L 29/0865* (2013.01); *H01L 29/0882* (2013.01); *H01L 29/7827* (2013.01); *H01L 29/7833* (2013.01)

(58) Field of Classification Search
None
See application file for complete search history.

(56) References Cited

U.S. PATENT DOCUMENTS

2020/0135583 A1* 4/2020 Saha ............... H01L 29/105

* cited by examiner

*Primary Examiner* — Hsien Ming Lee

(57) ABSTRACT

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have increased cost of ICs directly impacting the implementation of IoT devices that need low cost and high yields to be successful. LEFT-ISD-LTSEE is a device that reduces the cost while improving device performance. LEFT-ISD-LTSEE is suitable for sub 28 nm sizes where random threshold variation due to impact of discrete dopants in and around the channel is reduced by elimination of implants and drives. Also, by having a flat field profile at and around the gate, by use of low temperature epitaxy as source/drain extension, the short channel effects, and the impact of line edge variations of the gate are reduced.

13 Claims, 10 Drawing Sheets

Figures for LEFD using ISD-LTSEE

Low Electrostatic Field Device (IEFD)
Embodiment 1

Low Electrostatic Field Device (lEFD)
Embodiment 2

Exemplary Process Flows for the device
(On Silicon or Epi substrate)

Flow A

Table 1 (first embodiment) -. S/D implant before selective Epi

| Flow item | Masks | implants |
|---|---|---|
| Shallow trench | 2 | 0 |
| Constant well concentration for N and P devices | 2 | 2 |
| Grow sac oxide and strip and grow gate ox | 0 | 0 |
| Deposit amorphous silicon, Gate Mask, Gate Etch and grow side wall oxide | 2 | 0 |
| Deposit $1^{st}$ ( shallow) spacer material (1t), an-isotropic etch for $1^{st}$ Spacer formation | 0 | 0 |
| Implant N and P shallow S/D to reduce leakage and dope gates, anneal | 2 | 2 |
| Etch off $1^{st}$ spacer | 0 | 0 |
| Clean surface mask off P region grow selective N-Epi ( hard mask) | 1 | 0 |
| Mask off N- region grow selective P-Epi (hard mask) | 1 | 0 |
| Deposit 2nd spacer material(1.3 to 1.5t) and an-isotropic etch for 2nd Spacer formation | 0 | 0 |
| Clean surface and Silicide contacts | 0 | 0 |
| Deposit ILD, planarize and etch contacts to S,D and Gate | 1 | 0 |
| Refill contact holes and add metal / ILD as needed | - | - |
| Total masks and implants | 11 | 4 |

FIG.3

Table 2 (second embodiment) -. S/D implant through selective Epi

| Flow item | Masks | implants |
|---|---|---|
| Shallow trench | 2 | 0 |
| Constant well concentration for N and P devices | 2 | 2 |
| Grow sac oxide and strip and grow gate ox | 0 | 0 |
| Deposit amorphous silicon, Gate Mask, Gate Etch and grow side wall oxide | 2 | 0 |
| Clean surface mask off P region grow selective N-Epi ( hard mask) | 1 | 0 |
| Mask off N- region grow selective P-Epi (hard mask) | 1 | 0 |
| Deposit $1^{st}$ ( shallow) spacer material (1t), an-isotropic etch for $1^{st}$ Spacer formation | 0 | 0 |
| Implant N & P through Epi to form shallow S/D reduce leakage and dope gates, anneal | 2 | 2 |
| Etch off $1^{st}$ spacer | 0 | 0 |
| Deposit 2nd spacer material(1.3 to 1.5t), an-isotropic etch for 2nd Spacer formation | 0 | 0 |
| Clean surface and Silicide contacts | 0 | 0 |
| Deposit ILD, planarize and etch contacts to S,D and Gate | 1 | 0 |
| Refill contact holes and add metal / ILD as needed | - | - |
| Total masks and implants | 11 | 4 |

FIG.4

**Exemplary Process Flows for the device
(On SOI substrate)**

Flow B

Table 3 – First Embodiment on SOI ( No Well implant)

| Flow Item | Masks | implants |
|---|---|---|
| Shallow trench | 2 | 0 |
| Grow sac oxide and strip and grow gate ox | 0 | 0 |
| Deposit amorphous silicon, dope,Gate Mask, Gate Etch and grow side wall oxide | 2 | 0 |
| Deposit 1st spacer material (1t) and an-isotropic etch for 1$^{st}$ Spacer formation | 0 | 0 |
| Implant N and P shallow S/D to reduce leakage and gates, anneal | 2 | 2 |
| Etch 1$^{st}$ spacer | 0 | 0 |
| Clean surface mask off P region grow N-Epi extension | 1 | 0 |
| Mask off N- region grow P-Epi extension | 1 | 0 |
| Deposit 2nd spacer material(1.3 to 1.5t) and an-isotropic etch for 2nd Spacer formation | 0 | 0 |
| Clean surface and Silicide contacts | 0 | 0 |
| Deposit ILD, planarize and etch contacts to S,D and Gate | 1 | 0 |
| Refill contact holes and add metal / ILD as needed | - | - |
| Total masks and implants | 9 | 2 |

The above is based on "A' Flow. We can also use "B" Flow with the same mask and implant count

FIG.5

Table 4 – Second Embodiment on SOI ( No Well implant)

| Flow Item | Masks | implants |
|---|---|---|
| Shallow trench | 2 | 0 |
| Grow sac oxide and strip and grow gate ox | 0 | 0 |
| Deposit amorphous silicon, dope,Gate Mask, Gate Etch and grow side wall oxide | 2 | 0 |
| Clean surface mask off P region grow N-Epi extension | 1 | 0 |
| Mask off N- region grow P-Epi extension | 1 | 0 |
| Deposit 1st spacer material (1t) and an-isotropic etch for 1$^{st}$ Spacer formation | 0 | 0 |
| Implant N and P shallow S/D to reduce leakage and gates, anneal | 2 | 2 |
| Etch 1$^{st}$ spacer | 0 | 0 |
| Deposit 2nd spacer material(1.3 to 1.5t) and an-isotropic etch for 2nd Spacer formation | 0 | 0 |
| Clean surface and Silicide contacts | 0 | 0 |
| Deposit ILD, planarize and etch contacts to S,D and Gate | 1 | 0 |
| Refill contact holes and add metal / ILD as needed | - | - |
| Total masks and implants | 9 | 2 |

The above is based on "B' Flow. We can also use "B" Flow with the same mask and implant count

FIG.6

LEFT-ISD-LTSEE {LOW ELECTROSTATIC FIELD TRANSISTOR (LEFT) USING IMPLANTED S/D AND SELECTIVE LOW TEMPERATURE EPITAXIAL EXTENSION (ISD-LTSEE)}

FIELD OF INVENTION

This invention relates to semiconductor device and processing of the same with low or reduced electric fields reducing short channel issues for enabling miniaturization of the device.

BACKGROUND OF THE INVENTION

Over the past decade or more scaling of the semiconductor devices has been following Moore's law. But the scaling is bumping against issues of high levels of doping and short channel effects that limit the capabilities of the devices.

Device scaling has been instrumental in increasing the device density of integrated circuits (ICs) and reducing the cost of these circuits. Today development of new device structures, use of new materials and implementation of complex process steps have to be implemented to continue scaling of the semiconductor devices. The number of steps and cost of each step of processing ICs have also increased with the complexity increase. These process and technology innovations come with associated cost of circuit implementations.

It will hence be optimum if a simpler device structure with simpler processing (with reduced number of steps) that is closer to the current processing flows in the fab, having improved short channel effects is available to continue the scaling of devices.

DESCRIPTION OF FIGURES

FIG. 3—is a table 1 showing an exemplary process flow for implementing the first embodiment of the invention shown in FIG. 1 on silicon substrate.

FIG. 4—is a table 2 showing an exemplary process flow for implementing the second embodiment of the invention shown in FIG. 2 on silicon substrate.

FIG. 5—is a table 3 showing an exemplary process flow for implementing the first embodiment of the invention shown in FIG. 1 on SOI substrate.

FIG. 6—is a table 4 showing an exemplary process flow for implementing the second embodiment of the invention shown in FIG. 2 on SOI substrate.

DETAILED DESCRIPTION OF INVENTION

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have increased cost of ICs directly impacting the implementation of IoT devices that need low cost and high yields to be successful.

LEFT-ISD-LTSEE is a device that reduces the cost while improving device performance. LEFT-ISD-LTSEE is suitable for sub 28 nm sizes where random threshold variation due to impact of discrete dopants in and around the channel is reduced by elimination of implants and drives. Also, by having a flat field profile at and around the gate, by use of low temperature epitaxy as source/drain extension, the short channel effects, and the impact of line edge variations of the gate are reduced.

A simplified device technology that can be implemented with a reduced number of masking and other process steps is proposed. The device structure reduces the effect of short channel effects on the operation of the devices developed and allow the devices to be scaled with minimum increase in device complexity. The processing is made much simpler by reduction or elimination of implant steps and associated high temperature activation/drives but uses new available technology with lower temperature processing and selective epitaxial depositions. The replacement/elimination of critical implant and activation steps reduce uncertainty of dopant location relative to the channel and help reduce the associated variability of device characteristics. The reduction in short channel effects and reduction in variability of device characteristics enable the devices to move down the device scaling and integration path. The disclosed device and technology are usable for device processing on planar semiconductor wafers, on Silicon on Insulator (SOI) and even for unique device structures like FinFET at and below the 28 nm device dimensions.

Figure 1:
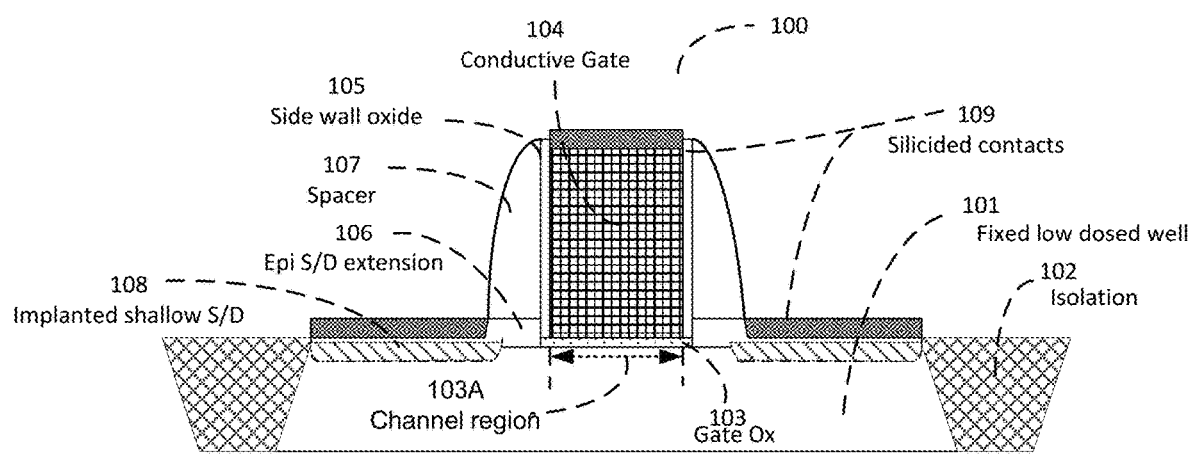
FIG. 1—is an exemplary and non-limiting cross sectional view of a first embodiment of the invention.
Figure 2:
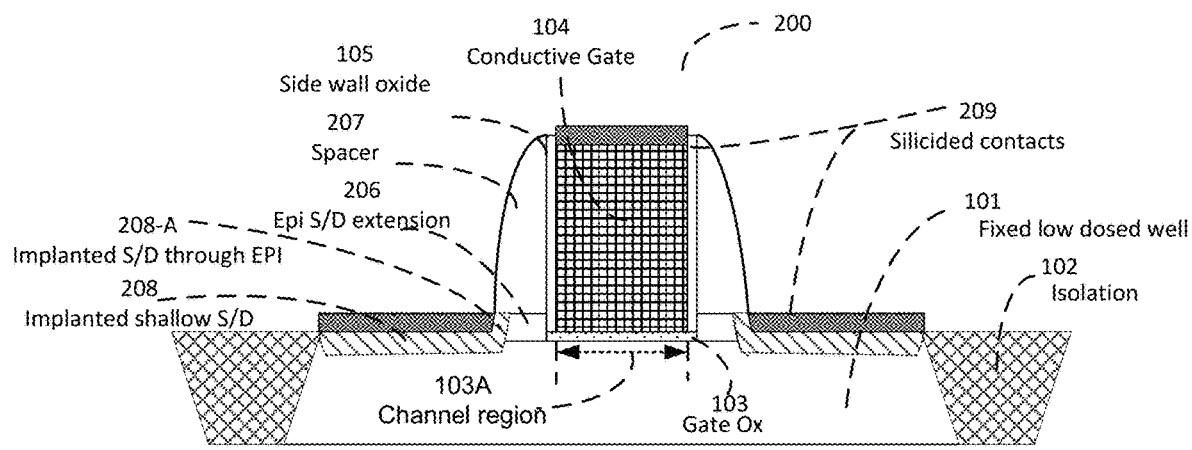
FIG. 2—is an exemplary and non-limiting cross sectional view of a second embodiment of the invention.

FIG. 1 and FIG. 2, show embodiments of the invention. This embodiment uses a sacrificial spacer to implement the source drain extension. The structure and process allow either silicon gate or metal gate technology to be implemented. As an exemplary process the silicon gate process is described. If the silicon gate is considered a sacrificial gate, the technology can be adapted for metal gate. Further the technology is also implementable on SOI wafers with equal ease.

FIG. 1 and FIG. 2 shows the completed structures of the low electrostatic field device (LEFT) 100 using implanted S/D and Selective Low Temperature Epitaxial Extension (ISD-LTSEE) as per the two preferred embodiment of the invention. The structures are very similar, and the difference is in the structure and process of the Source/Drain and the extensions. The details are provided in the processing description explained with the detailed FIG. 1A to 1E and 2A to 2E. The LEFD using ISD-SEE is shown on a silicon substrate. A shallow trench isolation 102 is used to define and isolate the device from neighboring structures. A fixed dopant concentration low dosed well 101 forms the active region of the REFD 100. A gate structure comprising a gate oxide 103 on silicon, with a conductive gate material 104 preferably amorphous silicon, having sidewall insulation dielectric 105 is used to control a channel region 103A under the gate oxide 103. A shallow S/D implant 108 implanted into the silicon provides the active Source and Drain regions 108 of the LEFT 100 device using ISD-LTSEE in silicon well 101. A thin epitaxial layer 106 A grown on silicon establish the Source and Drain extensions 106 and provide a vertical extension 108A of implanted Source and Drain regions 108 over the silicon surface. A spacer 107 is used to define the Source and Drain extensions 106 under the spacer.

The Source drain and the gate contact areas 109 are silicided to establish good low resistance contacts to Source, Drain and Gate.

FIG. 1A to FIG. 1E show process cross sections at various stages of processing of the first embodiment of the device and Table 1 shows an exemplary process flow comparison with the standard prior art process steps.

Figure 1A:
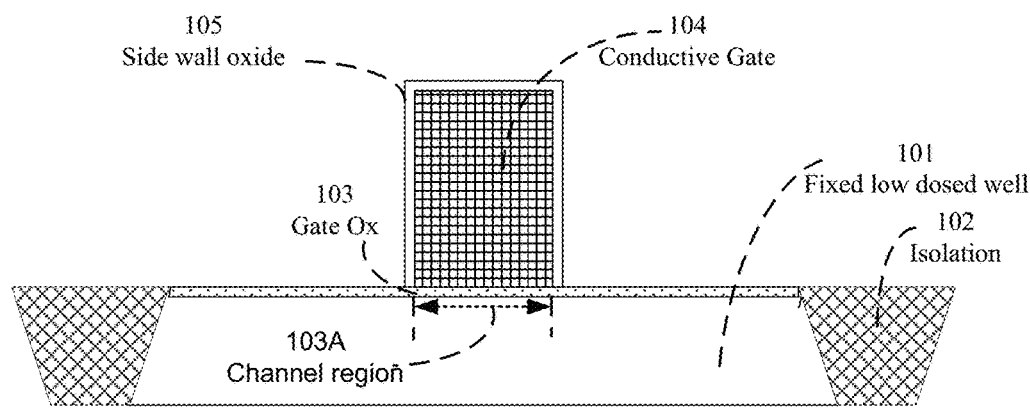
FIG. 1A to 1E—are cross sectional views of the embodiment shown in FIG. 1 through various device processing stages as described in the specification.

Referring to FIG. 1A

As shown in FIG. 1A, a shallow trench isolation 102 processes are done using standard device processing steps to isolate the device area on the substrate from neighboring devices.

A well implant is done, (prefer a low doped substrate) if needed to produce a low and uniformly doped well 101.

Grow sacrificial oxide, strip off and re-grow gate oxide 103.

Deposit conductive gate material, mask and etch to define a conductive gate layer 104 over the gate oxide 103.

Grow or deposit a sidewall dielectric 105 on the sides and top of the conductive gate layer 104 to complete the gate structure of the device.

Figure 1B:
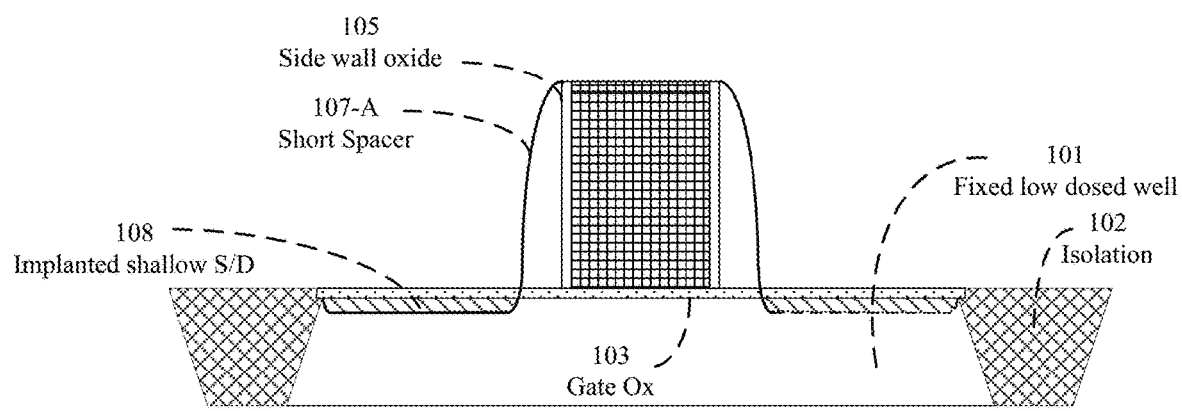

Referring to FIG. 1B

A spacer material, typically silicon nitride is deposited and an-isotropically etched to form a sacrificial spacer 107A.

Implant a very shallow Source and Drain 108 into the semiconductor material using the sacrificial spacer 107A to keep the implants away from the gate structure and hence the channel under the gate oxide 103.

Figure 1C:
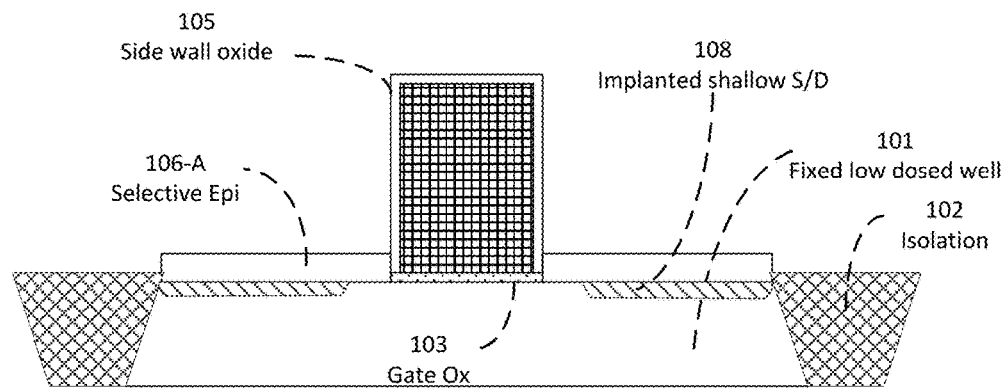

Referring to FIG. 1C

The sacrificial spacer 107A is etched off completely and the gate oxide left on the semiconductor well 101, except the gate oxide under the gate structure is etched off and the surface is cleaned.

A thin selective epitaxial layer of the correct in-situ doping 106A is grown using low temperature epitaxial growth on the surface over the well 101 on the exposed semiconductor on either side of the gate structure.

Figure 1D:
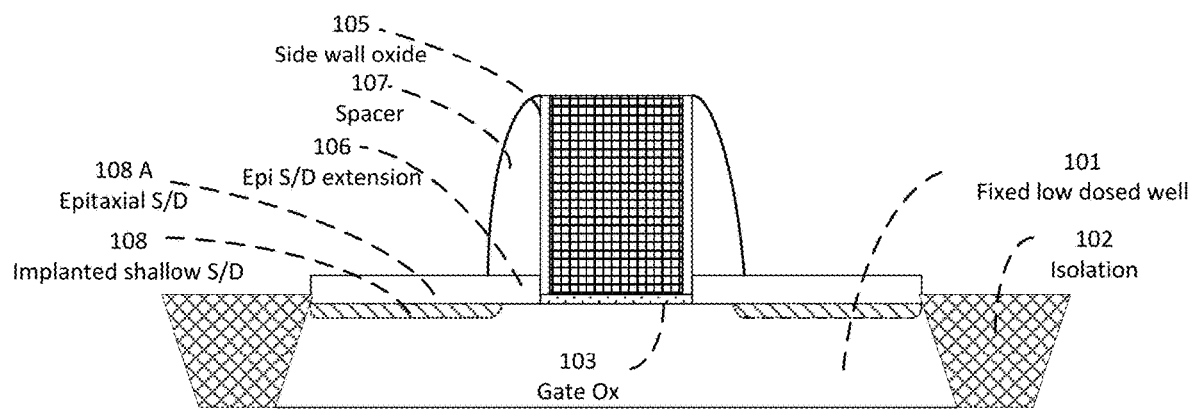

Referring to FIG. 1D

A new spacer is deposited which is larger in thickness than the previous spacer deposition.

An-isotropic etching is done to create a spacer 107 on the sides of the gate structure over the selective epitaxial layer. Since the spacer thickness is larger it will be spaced horizontally further from the gate structure and the channel under the gate oxide 103 and have its edge inside the implanted S/D regions 108. The implanted S/D will extend up through the selective epitaxial material 108A.

The selective epitaxial material under the spacer will form the source and drain extension for connecting the Source and Drain areas 108A to the channel region in the well under the gate structure (gate oxide 103). Since the thin Selective Epitaxial layer is grown on the surface of silicon it is possible to increase the doping in the epitaxial layer to reduce the resistivity of the extension regions and reduce the effective series resistance of the source and drain of the device to improve the drive current capability of the device. The epi thickness, temperature and time of growth and doping concentrations have to be modelled to ensure that there is no doping diffusion into the silicon substrate. (in some instances, a low level of penetration may be beneficial)

Figure 1E:
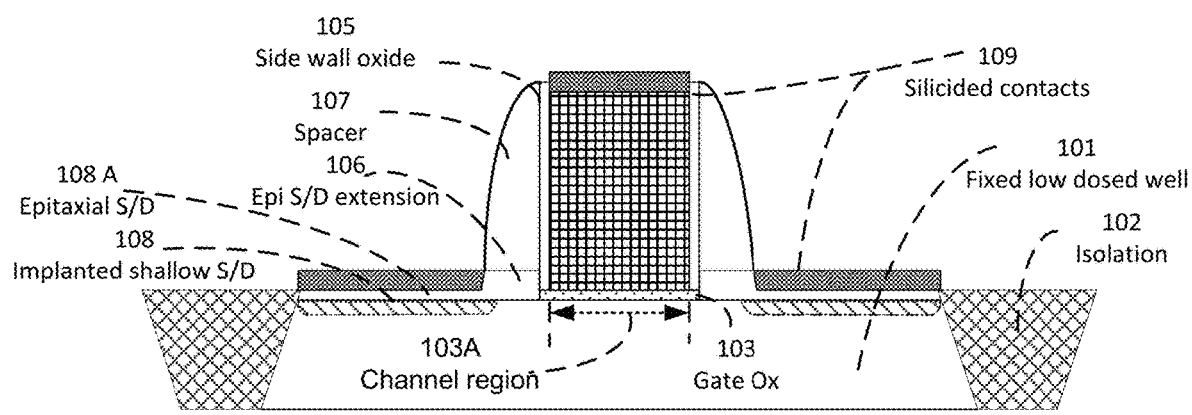

Referring to FIG. 1E

A metal such as palladium, Ti, platinum is deposited and a slicidation 109 of the exposed S/D and gate are done completing the device.

The Source and drain extensions 106 under the spacer 107 is used to connect the Source and drain regions that include the shallow implants 108 and the selective epitaxial region 108A above the shallow implants, to the channel region 103A under the gate oxide 103 that is controlled by the voltage applied to the gate.

At times the thin selective epitaxial region over the shallow S/D 108A will be completely consumed by the silicide formation. In such cases the shallow S/D region with overlap to the region that is silicided will prevent leakage current from the S/D 108A to the well 101.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to FIG. 3 showing Table 1.

FIG. 3—Table 1 provides a comparison of the steps required to implement P and N channel devices on a wafer. The common steps are grouped together in the table and a comparison of number of implants and masking steps required are provided. The comparison clearly shows the substantial reduction in critical process steps that are possible with the disclosed device implementation.

The post epitaxial implant and low temperature anneal/activation of the source drain junctions will provide a very shallow drive of the epitaxial doping into the silicon substrate to allow better contact from the source drain epitaxial extensions to the channel.

In addition, by providing a S/D extension which is on silicon surface almost in the plain of the channel, (there may be very slight diffusion into silicon substrate from the epi extension), the impact of source and drain on the channel that creates the short channel issues and the drain engineering requirements are reduced.

By providing non implanted Source/Drain extension using selective Epitaxial process and a uniformly doped well, the random variation of the doping ions on the threshold of the device due to random ions in or near the channel, namely the sigma Vt of the device is reduced substantially providing the device the capability to use lower supply voltages and scale to much smaller dimensions with very limited additional effort.

Referring to FIG. 5 showing Table 3.

FIG. 5—Table 3 provides a comparison of implementation of the disclosed device structure and process on SOI wafers as against the bulk semiconductor. As is clear the only difference in the process is reduction of the well masks. The SOI implementation provides all the advantages of the bulk implementation at a lower mask count. It also provides the capability for implementing back gate bias if required to reduce the leakages further.

FIG. 2A to 2E show the show process cross sections at various stages of processing of the second embodiment of the device and FIG. 4 showing Table 2 shows an exemplary process flow comparison with the standard prior art process steps.

Figure 2A:
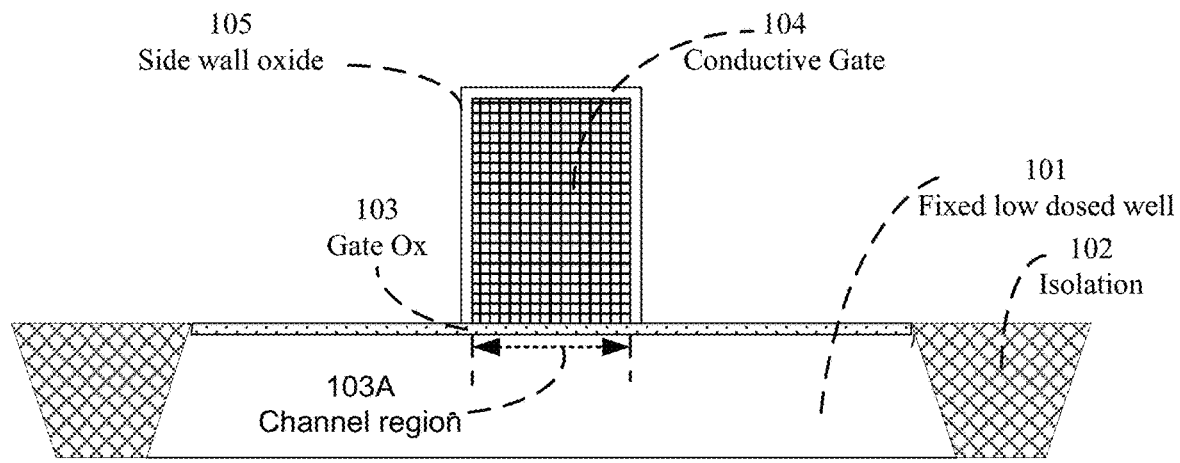
FIG. 2A to 2E—are cross sectional views of the embodiment shown in FIG. 2 through various device processing stages as described in the specification.

Referring to FIG. 2A

As shown in FIG. 2A, a shallow trench isolation 102 process is done using standard device processing steps to isolate the device area on the substrate from neighboring devices.

A well implant is done if needed to produce a low and uniformly doped well 101.

Grow sacrificial oxide, strip off and re-grow gate oxide 103.

Deposit conductive gate material, mask and etch to define a conductive gate layer 104 over the gate oxide 103.

Grow or deposit a sidewall dielectric 105 on the sides and top of the conductive gate layer 104 to complete the gate structure of the device.

Figure 2B:
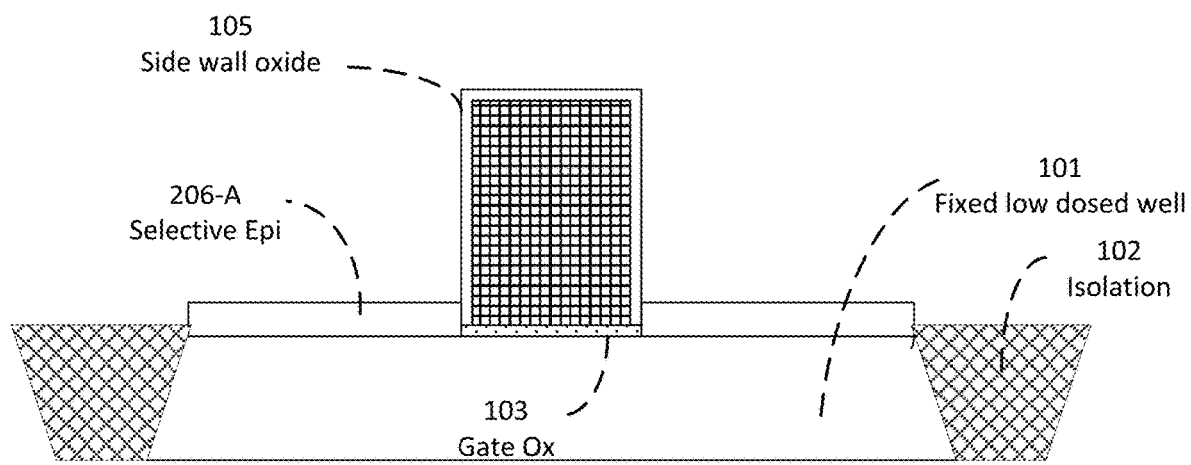

Referring to FIG. 2B

The surface oxide is cleaned from the substrate and a thin selective epitaxial layer of the correct in-situ doping 206A is grown on the surface over the well 101 on the exposed semiconductor on either side of the gate structure.

Figure 2C:
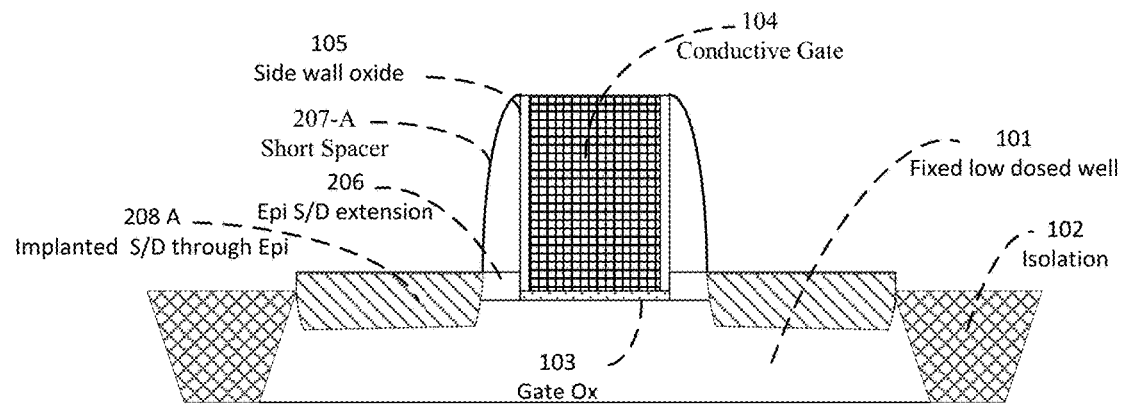

Referring to FIG. 2C

A spacer material, typically silicon nitride is deposited and an-isotropically etched to form a sacrificial spacer 207A.

Implant a very shallow Source and Drain 108 into the semiconductor material through the epitaxial layer 206A using the sacrificial spacer 207A to keep the implants away from the gate structure leaving a S/D extension 206 under the sacrificial spacer 207A, and hence keeping the implant away from the channel under the gate oxide 103. The thin epitaxial layer 208A outside the sacrificial spacer 107A is implanted through to form an implanted through epitaxial layer 208A to form the shallow S/D in the substrate implant.

Figure 2D:
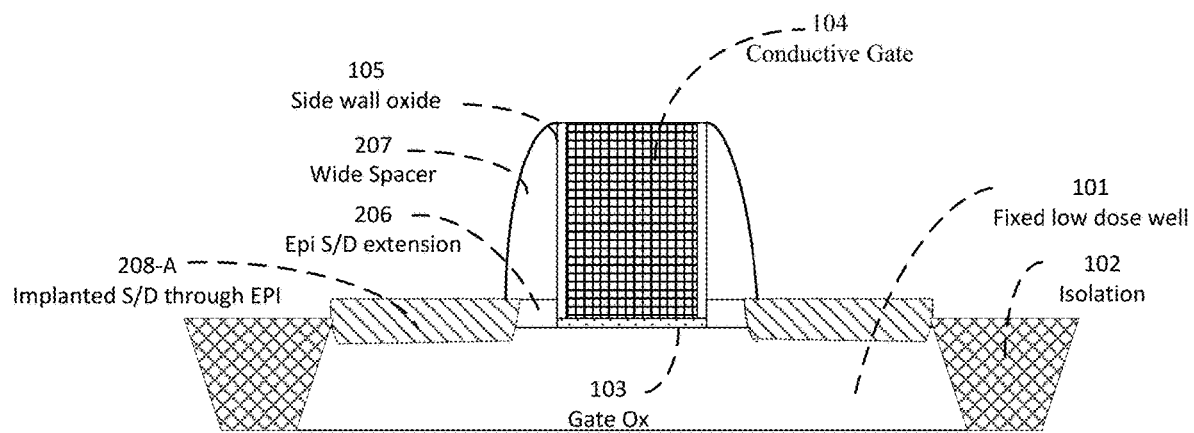

Referring to FIG. 2D

New spacer material is deposited which covers the existing spacer. An-isotropic etching is done to create a spacer 207 on the sides of the gate side wall oxide 105 that is larger than the original sacrificial spacer 207A, over the selective epitaxial layer forming the S/D extension 206 and the implanted through epitaxial layer 208 A. Since the spacer thickness is larger it will be spaced horizontally further from the gate structure and the channel under the gate oxide 103 and have its edge inside the implanted S/D regions 208A.

The selective epitaxial material under the spacer will form the source and drain extension for connecting the Source and Drain areas 208A to the channel region in the well under the gate structure (below gate oxide 103). Since the Selective Epitaxial layer is grown on the surface of silicon it is possible to increase the doping in the epitaxial layer to reduce the resistivity of the extension regions and reduce the effective series resistance of the source and drain of the device to improve the drive current capability of the device.

Figure 2E:
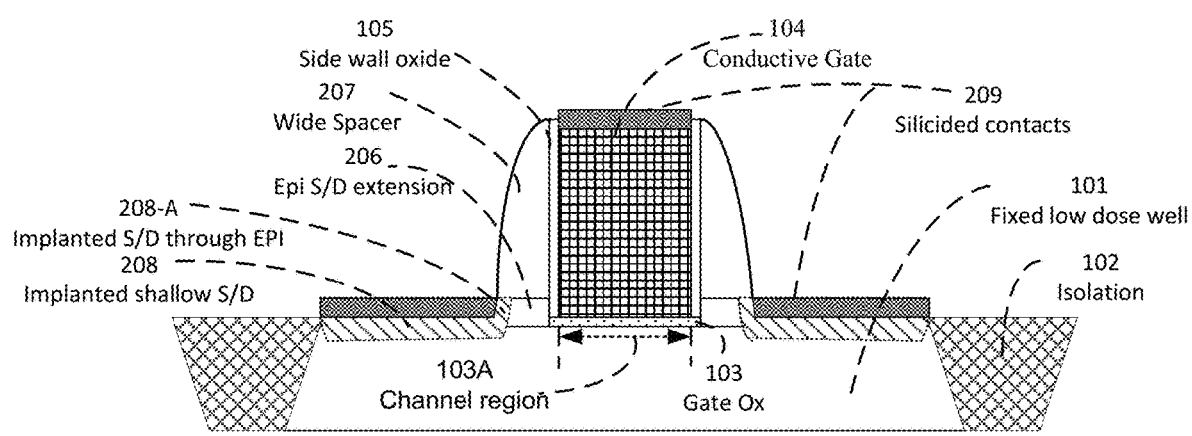

Referring to FIG. 2E

A metal such as palladium, Ti, platinum is deposited and a slicidation 209 of the exposed S/D and gate are done completing the device.

The Source and drain extensions 206 under the spacer 207 are used to connect the Source and drain regions that include the shallow implants 108 and implanted through selective epitaxial region 208A above the shallow implants, to the channel region 103A under the gate oxide 103 that is controlled by the voltage applied to the gate.

At times the thin implanted through selective epitaxial region over the S/D 208A will be completely consumed by the silicide formation. In such cases the shallow S/D region with overlap to the region that is silicided will prevent leakage current from the S/D 208 to the well 101.

Drain Engineering for Short Channel Effects and Strain.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to FIG. 4 showing Table 2.

FIG. 4—Table 2 provides a comparison of the steps required to implement P and N channel devices on a wafer. The common steps are grouped together in the table and a comparison of number of implants and masking steps required are provided. The comparison clearly shows the substantial reduction in critical process steps that are possible with the disclosed device implementation.

The post epitaxial implant and low temperature anneal/activation of the source drain junctions will provide a very shallow drive of the epitaxial doping into the silicon substrate to allow better contact from the source drain epitaxial extensions to the channel.

In addition, by providing a S/D extension which is on silicon surface almost in the plain of the channel, with very shallow diffusion of dopant from the high doped extensions, the impact of source and drain on the channel that creates the short channel issues and the drain engineering requirements are reduced.

By providing non implanted Source/Drain extension using selective Epitaxial process and a uniformly doped well, the random variation of the doping ions on the threshold of the device due to random ions in or near the channel, namely the sigma Vt of the device is reduced substantially providing the device the capability to use lower supply voltages and scale to much smaller dimensions with very limited additional effort.

Referring to FIG. 6—Table 4.

FIG. 6—Table 4 provides a comparison of implementation of the disclosed device structure and process on SOI wafers as against the bulk semiconductor. As is clear the only difference in the process is reduction of the well masks. The SOI implementation provides all the advantages of the bulk implementation at a lower mask count. It also provides the capability for implementing back gate bias if required to reduce the leakages further.

Some advantages of the current disclosed inventions described include:
1. Very low electrostatic field at source and drain junctions, allowing very small planar devices to be implemented and scaling to be continued.
2. Reduced variation of threshold (sigma Vt) over the designed value due to impact of discrete dopants in and around the channel.
3. Elimination of complex Drain engineering to achieve low fields impacting the gate.
4. Reducing the number of implants drastically, thereby reducing the total steps for device implementation.
5. Use of a sacrificial spacer (similar to spacer last) technology in one implementation with selective epitaxial growth for gate length control and low series resistance.
6. Use of low temperature processing to limit diffusion of dopants and associated gate length variations.
7. Very low diffusion from doped Epi to ensure S/D to channel connectivity under all conditions.
8. Elimination of implants and high temperature steps for establishing critical dimensions and device characteristics reduce the process related variations of threshold (sigma Vt) due to random dopant near and in the channel.

9. Reduced number of critical masking steps.
10. Overall reduction in complexity of process with associated cost reduction.
11. Implementable on planar silicon, and SOI substrates.
12. Can be implemented using silicon or metal gate technologies.
13. Strain engineering may be implemented in the usual manner if so desired with the technology.

Though the process and the implementation examples have been provided for both single crystal substrate and SOI substrate the technology shown should not be construed to be limited by the examples provided. The technology with additional changes is implementable into almost any semiconductor process, including high voltage process, FinFET process etc. with appropriate changes to improve the short channel effects and speed of the devices as will be well understood by practitioners of the art. These implementations though not shown in the application are being covered by the application.

Though a silicon based process is described in the current application, it should also be not considered limiting. The technology described may be implemented effectively to reduce process complexity and improve characteristic of other semiconductor devices, with changes in process as will be well understood by practitioners of the art. Other typical semiconductors include but are not limited to 3-5 compounds, Silicon Carbide etc. where the patent can be effectively applied.

What is claimed is:

1. A transistor device structure, enabled for providing reduced variability of threshold voltage induced by random dopant induced threshold voltage variations (sigma-Vt) and reduced short channel effects, the structure comprising: a lightly doped substrate, having a doping of $10^{16}$ to $5\times10^{17}$ atoms cm$^{-3}$;
   a gate structure having a conductive gate electrode over lying a gate dielectric on the substrate and having its side walls covered by a protective dielectric;
   a channel in the substrate, under the gate structure; the channel is under the gate dielectric under the conductive gate electrode;
   a shallow implanted source spaced away from the gate structure on a first side, but connected to the channel under the gate structure by an epitaxial source extension on the surface of the substrate, the epitaxial source extension in contact with and over laying the shallow implanted source, the epitaxial source extension in contact with the substrate, the epitaxial source extension on the surface of the substrate abuts the gate structure but is insulated from the conductive gate electrode by the protective dielectric on the side walls of the conductive gate electrode;
   a shallow implanted drain spaced away from the gate structure on a second side opposite the first side, but connected to the channel under the gate structure by an epitaxial drain extension on the surface of the substrate, the epitaxial drain extension in contact with and over laying the shallow implanted drain, the epitaxial drain extension in contact with the substrate, the epitaxial drain extension on the surface of the substrate abuts the gate structure but is insulated from the conductive gate electrode by the protective dielectric on the side walls of the conductive gate electrode;
   wherein the separation of the shallow implanted source and drain from the gate structure is adjusted and controlled by a sacrificial spacer;
   wherein the epitaxial source extension and drain extension are doped epitaxial layers of semiconducting material; and
   wherein the interfaces between the gate dielectric and the substrate, the epitaxial source extension and the substrate and the epitaxial drain extension and the substrate are all coplanar on the substrate surface.

2. The transistor structure of claim 1 wherein the substrate has doping of a first type and the shallow implanted source and drain and the epitaxial source extension and drain extension all have doping of a second type.

3. The transistor structure of claim 1 wherein the conductive gate electrode is metallic or semiconductor.

4. The transistor structure of claim 1 wherein the epitaxial source and drain extensions are deposited by selective epitaxy.

5. The transistor structure of claim 4 wherein the epitaxial source and drain extensions have a crystal structure that is continuous with that of the substrate.

6. The transistor structure of claim 1 wherein the epitaxial source and the epitaxial drain extensions over laying the substrate including the shallow implanted source and drain have a crystal structure that is continuous with that of the substrate.

7. The transistor structure of claim 1 wherein the protective dielectric that separates the epitaxial source extension and the epitaxial drain extension from the gate is as thick as or thicker than the gate dielectric thickness.

8. The transistor structure of claim 1, wherein a silicide is formed on the surface of the epitaxial source and epitaxial drain extensions over the shallow implanted source and drain for making contact to the shallow implanted source and drain and the source and drain extensions.

9. The transistor structure of claim 1 wherein an electrostatic fields perpendicular to an interface plane between the gate dielectric and the substrate are less than $5\times10^5$ volts/cm over more than 50% of an area of the channel under all operating conditions.

10. The transistor structure of claim 1 wherein the substrate having a doping of $10^{16}$ to $5\times10^{17}$ atoms per cm$^{-3}$.

11. The transistor structure of claim 1 wherein the substrate has a well doping that is retrograde in nature.

12. The transistor structure of claim 1 wherein the substrate comprises a surface layer that is an epitaxial layer deposited over the substrate.

13. The transistor structure of claim 1 in which the substrate comprises silicon over an insulator.

* * * * *